United States Patent [19]
Toda et al.

[11] 4,090,153
[45] May 16, 1978

[54] SURFACE ACOUSTIC WAVE ABSORBER

[75] Inventors: Minoru Toda; Susumu Osaka, both of Machida, Japan

[73] Assignee: RCA Corporation, New York, N.Y.

[21] Appl. No.: 694,041

[22] Filed: Jun. 7, 1976

[51] Int. Cl.² .............. H03H 9/06; H03H 9/26; H03H 9/30; H01L 41/10
[52] U.S. Cl. .................. 333/30 R; 310/313; 310/326; 333/72
[58] Field of Search .............. 333/30 R, 72, 29; 331/107 A; 330/5.5; 235/181; 310/9.4, 9.7, 9.8, 313, 326, 327; 358/213

[56] References Cited
U.S. PATENT DOCUMENTS

| | | | |
|---|---|---|---|
| 3,551,837 | 12/1970 | Speiser et al. | 333/30 |
| 3,872,410 | 3/1975 | Zucker | 333/72 |
| 4,037,180 | 7/1977 | De Wild | 333/72 |

FOREIGN PATENT DOCUMENTS 1,389,610  4/1975  United Kingdom ............ 333/30 R Primary Examiner—Alfred E. Smith
Assistant Examiner—Marvin Nussbaum
Attorney, Agent, or Firm—H. Christoffersen; B. E. Morris; A. Stephen Zavell

[57] ABSTRACT

The surface acoustic waves reflecting from the edges of a surface acoustic wave device, designed for low frequency application, are attenuated by placing an epoxy resin or a powder-epoxy resin mixture near the edge of the surface acoustic wave device.

8 Claims, 1 Drawing Figure

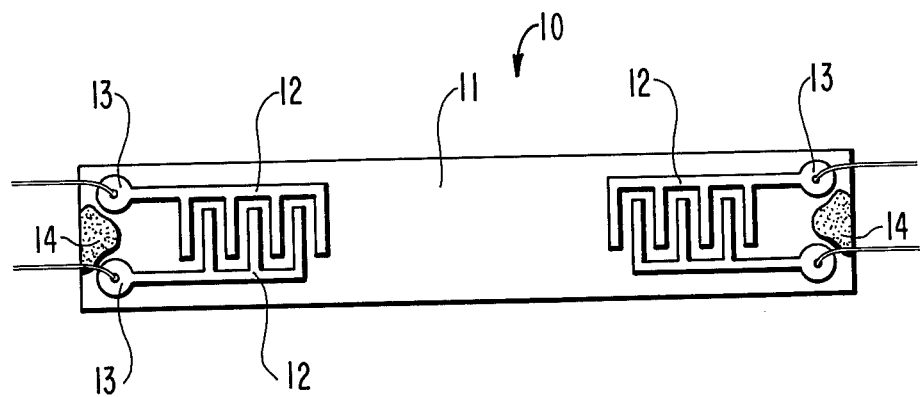

SURFACE ACOUSTIC WAVE ABSORBER

BACKGROUND OF THE INVENTION

In surface acoustic wave (SAW) devices, reflections from the edges of the propagation plane must be suppressed to prevent distortion of the signal. Where the SAW device is designed for application in the 50–300 MHz range, it is known that the edge reflections of surface acoustic waves can easily be absorbed, suppressed or attenuated by applying a liquid (e.g. water), wax, (See Richardson et al., Applied Physics Letters 16, 2 pp. 82–84 (1970)), a masking tape, adhesive tape or scotch tape or glue to the edges of the SAW device. For a discussion of elastic surface waves, see Dransfeld et al., Physical Acoustics, Vol. 7, pp. 219–272, particularly 235, 259–263, Academic Press, New York, 1970. SAW devices operating at a lower frequency are being studied for application as a frequency discriminator and as an IF filter in the IF circuit of FM receivers. At this lower frequency, i.e. 10.7 MHz, the absorption of the surface acoustic waves by the above materials is inadequate. It is desirable to provide more suitable materials for attenuating the edge reflections of a surface acoustic wave device. The present invention provides such materials.

SUMMARY OF THE INVENTION

The present invention provides a surface acoustic wave device, designed for low frequency application, having thereon an epoxy resin or a powder-epoxy resin mixture for attenuating the edge reflections.

BRIEF DESCRIPTION OF THE DRAWINGS

The single FIGURE shows, in plan view, a surface acoustic wave device having thereon a surface acoustic wave absorber of the present invention.

DETAILED DESCRIPTION OF THE INVENTION

Surface acoustic wave devices can operate at different frequencies. An acoustic medium suitable for operation at 10.7 MHz is a 127.9° rotated Y-cut X-propogation lithium niobate crystal. A SAW device 10 according to our invention is shown in the single FIGURE. A LiNbO$_3$ acoustic medium 11 has a pair of interdigitated electrodes or transducers 12 having leads 13 on the surface. An absorber 14 is placed at least between the leads 13 in order to absorb surface acoustic waves. The absorber 14 can extend beyond the leads and reach the edges.

Various materials have been applied as the absorber 14. As can be seen in TABLE 1 below, which compares an epoxy resin of the present invention and previously used materials, the epoxy resin provides superior results. The previously used materials, e.g. sticky tape, water, paraffin wax, and overlayed glue, show an attenuation varying from 17 to 41.7 dB/cm (decibels per centimeter) whereas the epoxy resin of the present invention has an attenuation of from 48 to 62 dB/cm.

TABLE 1

| Material | Brand Name | Manufacturer | Attenuation, dB/cm |
|---|---|---|---|
| Sticky Tape (1 sheet) | Scotch Magic Mending Tape | Sumitomo-3M Japan | 17 |
| Sticky tape (2 sheets) | Scotch Magic Mending Tape | Sumitomo-3M Japan | 22 |
| Water | | | 31.7 |
| Paraffin | | | 32.4 |
| Composition Rubber Cement (yellow) | Sony bond (tough) | Sony Chemical Corp. Japan | 41.7 |
| Epoxy Resin (solidify in 20 hrs.) | Araldite | CIBA Limited Switzerland | 48 |
| Epoxy Resin (solidify in 15 min.) | Hi-Super | Cemedine Corp. Japan | 62 |

The epoxy resin is preferably applied as a liquid epoxy resin, which is hardenable by a conventional hardener. The liquid epoxy resin may be prepared by using bisphenol-A and epichlorohydrin as the base. Suitable epoxy resins used in this invention include epoxy resins containing at least two terminal epoxy groups which are liquid at room temperature, such as, a bisphenol A-epichlorohydrin type, a side-chain type, an alicyclic type, a polmerized aliphatic ester type, a novolak type, a butyl glycidyl ether type, a poly alkylene type, a glyceryl tricpoxide type, and an alkylphenol type epoxy resin. Illustrative liquid epoxy resins, having at least the terminal epoxy groups, include expoxidized glycerin dialiphatic esters, 1,4-bis(2,3-epoxy-propoxy)benzene, 1,3-bis(2,3-epoxy-propoxy)benzene, 4,4'-bis (2,3-epoxy-propoxy)diphenyl ether, 1,8-bis(2,3-epoxy-propoxy)octane, 1,4-bis(2,3-epoxy-propoxy)cyclohexane, 4,4-bis(2-hydroxy-3,4'-epoxy-butoxy)- diphenyldimethyl methane, 1,3-bis(4,5-epoxy-pentoxy)5-chlorobenzene, 1,4-bis(3,4-epoxy-butoxy)-2-chlorocylcohexane, 1,3-bis(2-hydroxy-3,4-epoxy-butoxy)benzene and 1,4-bis-(2-hydroxy-4,5-epoxy-pentoxy)benzene. A mixture containing more than 70% by weight of a liquid epoxy resin and less than 30% by weight of a solid epoxy resin which is soluble in the liquid epoxy resin can also be used. Suitable epoxy hardeners include polyamines, amine adducts, polyamides, and the like.

The attenuation of SAW devices can be further increased by dispersing suitable powders into the epoxy resin. Attenuation of a surface acoustic wave varies with the amount or type of powder material mixed in with the epoxy resin. The attenuation with specific powders are shown in Table 2. The attenuation increases with an increasing quantity of powder. The ratio of cement powder to epoxy resin, however, should not be greater than above about 2.6:1 because the adhesive property of the mixture diminishes with the higher powder content.

TABLE 2

| Material Combination | Weight Ratio | Attenuation, dB/cm |
|---|---|---|
| Epoxy Resin Ni powder | 3:20 | 64.1 |
| Epoxy Resin Al$_2$O$_3$ powder | 1:2.5 | 76.1 |
| Epoxy Resin Cement powder | 1:1 | 81.1 |
| Epoxy Resin Cement powder | 1:2.6 | 102 |
| Epoxy Resin | 1:1 | 85 |

TABLE 2-continued

| Material Combination | Weight Ratio | Attenuation, dB/cm |
| --- | --- | --- |
| $Bi_2O_3$ powder | | |

The epoxy resin used in Table 2 was the "Hi-Super" (Cemedine Corporation) of Table 1. Other powders, such as tungsten oxide, and silver, have also been found to be suitable. The preferred powder is a hydraulic cement powder, particularly Portland cement, as this material is relatively inexpensive and produces good results. The particle size of the powder is not critical. It is preferred, however, that the particle size be small, i.e. in the range of from about 2–50 microns.

While lithium niobate has been illustrated hereinabove, the invention may also be used to attenuate SAW on other piezoelectric materials such as $LiTaO_3$, and/or ceramic materials. Although suppression of reflectors when using an interdigitated transducer has been illustrated hereinabove, the invention may also be used to suppress or attenuate SAW reflections when other transducers are employed.

We claim:

1. A surface acoustic wave device comprising a piezoelectric substrate, a pair of transducers having leads on said substrate and a surface acoustic wave absorber comprising an epoxy resin admixed with a powder filler.

2. The device of claim 1, wherein said surface acoustic wave absorber is at opposite edges of said substrate and a pair of interdigitated transducers is between said opposite edges and the acoustic wave absorber is at least between said leads.

3. The device of claim 1, wherein the powder filler is selected from the group consisting of Ni, $Al_2O_3$, $Bi_2O_3$, $WO_3$, and cement.

4. The device of claim 1, wherein the powder filler has a particle size of from 2 to 50 microns.

5. The device of claim 1, wherein cement and epoxy resin in a ratio of 2.6:1 is used as the power filler-epoxy resin mixture.

6. A method of attenuating the surface acoustic waves reflecting from the edges of a surface acoustic wave device comprising a piezoelectric substrate, at least one transducer having leads on said piezoelectric substrate and designed for low frequency application, which comprises placing an epoxy resin admixed with a power filler between adjacent electrode leads near the edge of said surface acoustic wave device.

7. A method of claim 6, wherein the surface wave acoustic device operates at a frequency of about 10.7 MHz.

8. The method of claim 6 wherein said powder filler is selected from the group consisting of cement, nickel, silver, $Al_2O_3$ and $Bi_2O_3$ and $WO_3$.

* * * * *

UNITED STATES PATENT OFFICE
CERTIFICATE OF CORRECTION

PATENT NO. : 4,090,153

DATED : May 16, 1978

INVENTOR(S) : M. Toda et al

It is certified that error appears in the above-identified patent and that said Letters Patent are hereby corrected as shown below:

Col. 2, line 31            "tricpoxide" should be -- triepoxide --;

Claim 3, line 3            after "$WO_3$" insert -- Ag --.

Signed and Sealed this

Tenth Day of October 1978

[SEAL]

Attest:

RUTH C. MASON
*Attesting Officer*

DONALD W. BANNER
*Commissioner of Patents and Trademarks*